United States Patent [19]

Kanai et al.

[11] Patent Number: 4,918,563
[45] Date of Patent: Apr. 17, 1990

[54] ECL GATE ARRAY SEMICONDUCTOR DEVICE WITH PROTECTIVE ELEMENTS

[75] Inventors: Yasunori Kanai, Inagi; Kazumasa Nawata; Mitsuhisa Shimizu, both of Kawasaki; Toshiaki Sakai, Tokyo, all of Japan

[73] Assignee: Fujitsu Limited, Kawasaki, Japan

[21] Appl. No.: 316,532

[22] Filed: Feb. 27, 1989

Related U.S. Application Data

[63] Continuation of Ser. No. 91,321, Aug. 31, 1987, abandoned, which is a continuation of Ser. No. 942,921, Dec. 17, 1986, abandoned, which is a continuation of Ser. No. 653,740, Sep. 24, 1984, abandoned.

[30] Foreign Application Priority Data

Sep. 22, 1983 [JP] Japan .................................. 58-175974

[51] Int. Cl.⁴ .............................................. H02H 3/20
[52] U.S. Cl. ........................................ 361/91; 361/111; 357/43
[58] Field of Search .................... 361/54, 56, 59, 91, 361/111; 357/13, 45, 48, 51, 23.13

[56] References Cited

U.S. PATENT DOCUMENTS

| | | | |
|---|---|---|---|
| 4,100,561 | 7/1978 | Ollendorf | 357/13 |
| 4,131,908 | 12/1978 | Daub et al. | 357/23.13 X |
| 4,255,672 | 3/1981 | Ohno et al. | 357/51 X |
| 4,278,897 | 7/1981 | Ohno et al. | 357/45 |
| 4,282,556 | 8/1981 | Ipri | 361/111 X |
| 4,439,802 | 3/1984 | Johansson | 361/111 X |
| 4,481,521 | 11/1984 | Okumura | 361/111 X |
| 4,559,579 | 12/1985 | Val | 361/56 X |
| 4,567,500 | 1/1986 | Avery | 351/13 X |
| 4,631,567 | 12/1986 | Kokado et al. | 361/56 X |

FOREIGN PATENT DOCUMENTS

| | | | |
|---|---|---|---|
| 0032046 | 7/1981 | European Pat. Off. | |
| 0042581 | 12/1981 | European Pat. Off. | |
| 0073641 | 9/1983 | European Pat. Off. | |
| 0079463 | 6/1981 | Japan | 357/23.13 |
| 0115844 | 7/1983 | Japan | 357/23.13 |

*Primary Examiner*—William M. Shoop, Jr.
*Assistant Examiner*—A. Jonathan Wysocki
*Attorney, Agent, or Firm*—Armstrong, Nikaido, Marmelstein, Kubovcik & Murray

[57] ABSTRACT

A semiconductor device such as an ECL gate array having emitter-follower-type output transistors, wherein protective elements are arranged between input/output pads and a power supply line connected to the collectors of the emitter-follower-type output transistors, whereby wiring between the protective elements and the power supply line become unnecessary so that the manufacturing process becomes easy and the integration degree is improved while a large tolerance voltage is maintained against destruction due to static electricity.

2 Claims, 10 Drawing Sheets

ECL GATE ARRAY SEMICONDUCTOR DEVICE WITH PROTECTIVE ELEMENTS

This application is a continuation of application Ser. No. 091,321, filed Aug. 31, 1987, now abandoned, which is a continuation of application Ser. No. 942,921, filed 12/17/86, now abandoned, which is a continuation of application Ser. No. 653,740, filed Sept. 24, 1986, now abandoned.

BACKGROUND OF THE INVENTION

1. Field of the Invention

The present invention relates to a semiconductor with protective elements, more particularly, to a bipolar-type semiconductor device, such as an emitter-coupled-logic (ECL) circuit device, having elements protecting against static electricity, the protective elements being compactly incorporated within the semiconductor device.

2. Description of the Prior Art

Generally, although bipolar-type semiconductor devices are more resistant to electrostatic destruction than metal-oxide semiconductor (MOS) devices, their tolerance voltage to electrostatic destruction has become lower along with the use of shallower junctions in the bipolar transistors and finer circuit patterns. This is especially true of ECL circuit devices. Therefore, in conventional bipolar-type semiconductor devices such as ECL circuit devices, elements has been incorporated into the semiconductor devices to protect against electrostatic breakdown destruction.

In conventional devices such as ECL circuit devices, however, each protective element is connected between an input terminal or an output terminal and a negative voltage-power supply lines. Since the negative-voltage power supply line is provided considerably apart from the input terminal or the output terminal, a wiring pattern for connecting each protective element and the negative-voltage power supply line is necessary. It is difficult to compactly incorporate the protective elements into the semiconductor device due to the wiring pattern.

In addition, conventional protective elements do not operate as transistors but only as a diode or diodes. Diodes conduct smaller current than transistors. Therefore, the capability of drawing abnormal charges is considerably low. Therefore, conventional semiconductor devices have considerably low tolerance voltage against electrostatic destruction.

SUMMARY OF THE INVENTION

Accordingly, an object of the present invention is to provide a bipolar-type semiconductor device, such as an ECL circuit device, compactly incorporating protective elements for improved integration.

Another object of the present invention is to provide a bipolar-type semiconductor device, such as an ECL circuit device, with protective elements having improved current drawing capability for a higher tolerance voltage of the semiconductor device.

To attain the above objects, there is provided, according to the present invention, a semiconductor device including an internal gate region having a plurality of internal gates arranged on a central portion of a chip; a plurality of emitter-follower-type output transistors arranged on a peripheral region of the chip, the output transistors being provided for receiving signals from the internal gates and for outputting signals to external portions of the semiconductor device; a power supply line arranged on the peripheral portion of the chip and connected to the output transistors; a plurality of input/output pads arranged on the peripheral portion of the chip and connected to the internal gates or to the output transistors; and a plurality of protective elements arranged at a vicinity of the input/output pads and of a power supply line, the protective elements being connected between the input/output pads and the power supply line, the protective elements being so constructed as to be conductive when a high electrostatic energy is applied to the input/output pads, for preventing the destruction of the internal gates or the output transistors.

BRIEF DESCRIPTION OF THE DRAWINGS

The above objects and advantages as well as other features of the present invention will be more apparent from the following description of the preferred embodiments with reference to the accompanying drawings, wherein.

DESCRIPTION OF THE PREFERRED EMBODIMENTS

Before describing the embodiments of the present invention, a conventional semiconductor device and its problems will first be described by way of an ECL gate array with reference to FIGS. 1 through 4.

Figure 1:
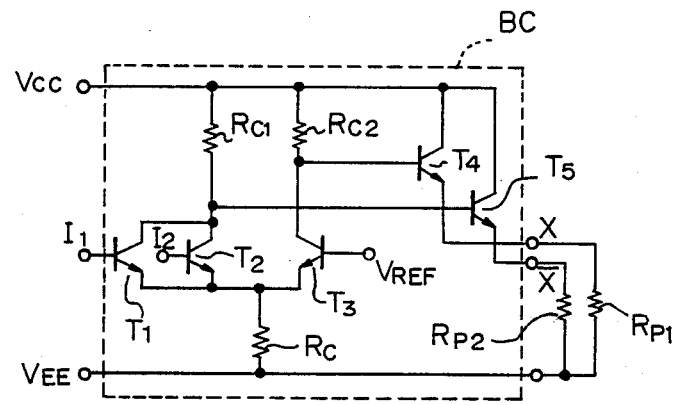
FIG. 1 shows a well known basic circuit of an internal ECL gate provided in an ECL gate array.
Figure 2:
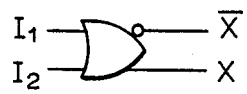
FIG. 2 is an equivalent circuit diagram of the ECL gate shown in FIG. 1.

FIG. 1 shows an example of a well known basic circuit of an internal ECL gate provided in an ECL gate array. FIG. 2 is an equivalent circuit of the ECL gate shown in FIG. 1. In FIGS. 1 and 2, the basic circuit BC of the ECL gate has the following logical OR functions, i.e., $$X = \overline{I_1 + I_2}$$
$$X = I_1 + I_2$$

$I_1$ and $I_2$ are logical levels of two inputs, and X and $\overline{X}$ are logical levels of two outputs. The bases of input transistors $T_1$ and $T_2$ are respectively connected to input terminals (also referred to as $I_1$ and $I_2$). The collectors of the input transistors $T_1$ and $T_2$ are connected through a pull-up resistor $R_{C1}$ to a power supply line $V_{CC}$, which is usually at 0 V. The emitters of the input transistors $T_1$ and $T_2$ are connected through a constant-current resistor $R_C$ to a negative-voltage power supply line $V_{EE}$, which is usually at −5.2 V.

When a large negative voltage is applied to the input terminal $I_1$ or $I_2$ due to static electricity, the base-emitter junction and the base-collector junction the input transistor $T_1$ or $T_2$ are reversely biased, resulting in breakdown of the PN junctions between the base and the emitter and between the base and the collector. This breakdown generates a high temperature between these PN junctions. The generated high temperature causes a eutectic reaction, especially between the emitter electrode and the emitter diffusion region, with the result that the melted emitter electrode penetrates through the emitter diffusion region into the base diffusion region under the emitter diffusion region. Therefore, the input transistor $T_1$ or $T_2$ may be destroyed when a large negative voltage applied to the input terminal $I_1$ or $I_2$. Usually, before operation, the ECL gate array is independently brought to the necessary place on a semiconductor device without applying the power supply voltages $V_{CC}$ and $V_{EE}$. In such a case, a large negative voltage due to static electricity may often be applied to the input terminals $I_1$ and $I_2$ by, for example, the fingers of the human body.

Assume that the basic circuit BC is not the internal ECL gate but is a final stage of the ECL gate array. In such a case, emitter-follower-type output transistors $T_4$ and $T_5$ are of large power and have emitters directly connected to output terminals (also referred to as X and $\overline{X}$) of the ECL gate array. That is, resistors $R_{P1}$ and $R_{P2}$ are connected to the output terminals X and $\overline{X}$ from the outside of the ECL gate array.

Regarding the output terminals X and $\overline{X}$ when a high positive voltage is applied to the output terminal X or $\overline{X}$, the base-emitter junction of the emitter-follower-type output transistor $T_4$ or $T_5$ is reversely biased, resulting in a short-circuit between the emitter and the base by a eutectic reaction in a similar manner as in the above-mentioned case. Therefore, the output transistor $T_4$ or $T_5$ may be destroyed when a large positive voltage is applied to the output terminal X or $\overline{X}$. It should be noted that, in the ECL circuit as shown in FIG. 1, resistors $R_{P1}$ and $R_{P2}$ adapted to be connected to the emitters of the output transistors $T_4$ and $T_5$ are not provided in the chip of the ECL circuit. In other words, the output terminals X and $\overline{X}$ the ECL circuit are directly exposed outside of the chip. Therefore, when a high positive voltage is applied to the output terminal X or $\overline{X}$ without connecting the resistors $R_{P1}$ and $R_{P2}$ to the output terminals X and $\overline{X}$, respectively, breakdown of the base-emitter junctions will easily occur.

In order to prevent the above-mentioned junction destruction, it is necessary to limit the electric power consumed in the junction. However, limiting the power consumed in the junction is difficult in practice.

In addition to the above-mentioned destruction of the emitter-base junction and of the base-collector junction, there are other types of destruction due to static electricity applied to the ECL gate array, i.e., destruction of a wiring line from an input/output terminal to the internal circuit and destruction of an insulating film between a wiring line from an input/output terminal to an internal circuit and the bulk of the semiconductor device. To prevent the former type of destruction, it is necessary to limit the current from the terminal to the internal circuit. To prevent the latter type of destruction, it is necessary to limit the voltage applied to the terminal or to make the insulating film thicker. However, it is difficult in practice to limit the current or voltage or to make the insulating film thicker.

Conventionally, to prevent destruction of the ECL gate array due to static electricity, a protective element is connected between the input terminal $I_1$ or $I_2$ and the negative-voltage power supply line $V_{EE}$.

Figure 3:
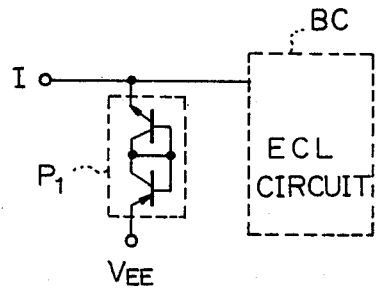
FIG. 3 shows an example of a conventional ECL gate.
Figure 4:
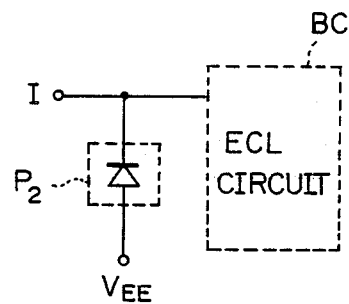
FIG. 4 shows another example of a conventional ECL gate.

FIGS. 3 and 4 show two examples of conventional ECL gates. As shown in FIGS. 3 and 4, a protective element $P_1$ or $P_2$ is connected between an input terminal I and the negative-voltage power supply line $V_{EE}$. The input terminal I in FIGS. 3 and 4 is equivalent to the input terminal $I_1$ or $I_2$. The basic circuit BC of the ECL circuit device is the same as that shown in FIG. 1.

In operation, when a negative voltage is applied to the input terminal I, a current flows from the negative-voltage terminal $V_{EE}$ through the protective element $P_1$ or $P_2$ to the input terminal I. Thus, the basic circuit BC is protected from being destroyed due to static electricity.

There are problems, however, in the conventional circuit devices. That is, because the conventional protective elements $P_1$ and $P_2$ are connected to the negative-voltage power supply line $V_{EE}$ and because the negative-voltage power supply line $V_{EE}$ is provided considerably apart from the input terminal I, it is necessary to provide a wiring pattern between each protective element and the negative-voltage power supply line. It is difficult to compactly incorporate the protective elements into the ECL gate array due to the wiring pattern. In addition, because the conventional protective element $P_1$ or $P_2$ does not operate as a transistor but only as a diode or diodes which conduct a smaller current than transistors, the capability of drawing abnormal charges is considerably low. Therefore, the conventional basic circuit BC of the ECL gate has a considerably low tolerance voltage against destruction due to static electricity.

Embodiments of the present invention will now be described.

Figure 5:
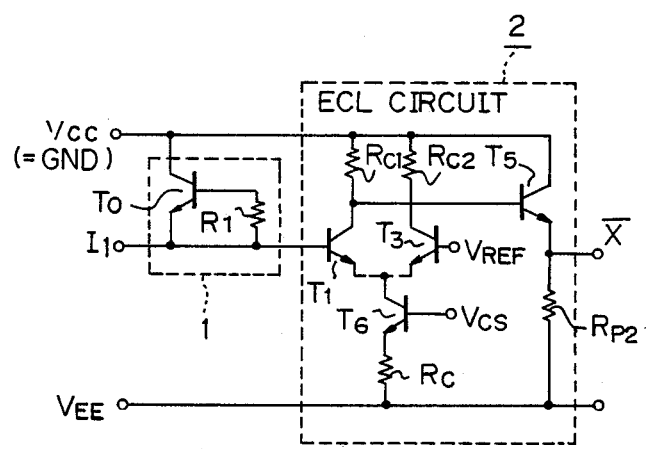
FIG. 5 is a circuit diagram of an ECL gate provided in the internal region of an EC gate array, according to an embodiment of the present invention.

FIG. 5 is a circuit diagram of an ECL gate provided in the internal region of an ECL gate array, according to an embodiment of the present invention. In FIG. 5 and in the other drawings, the same reference characters designate the same portions. In FIG. 5, a protective element 1 is connected between the input terminal $I_1$, which is an input pad of the ECL gate array in this case, and the high potential power supply line $V_{CC}$, which is usually grounded. In this case, the output terminal $\overline{X}$ is connected to internal gates of an ECL gate array. The protective element 1 includes an NPN transistor $T_0$ having a collector connected to the power supply line $V_{CC}$, an emitter connected to the input terminal $I_1$, and a base connected through a resistor $R_1$ to the input terminal $I_1$, which is connected to the base of the input transistor $T_1$.

An ECL circuit 2 is substantially the same as the basic circuit BC of the ECL circuit shown in FIG. 1, except that, in FIG. 5, a single input transistor T and a single emitter-follower-type output transistor $T_5$ are provided in place of the two input transistors $T_1$ and $T_2$ and two emitter-follower-type output transistors $T_4$ and $T_5$, and a transistor $T_6$ for constructing a constant current source is provided between the emitters of the transistors $T_1$ and $T_3$ and the resistor $R_C$. The transistor $T_6$ receives at its base a bias voltage $V_{SC}$. The transistor $T_3$ receives at its base a reference voltage $V_{REF}$. The transistors $T_1$ and $T_3$ constitute a current switch. The ECL circuit 2 may, of course, be replaced by the basic circuit BC shown in FIG. 1. In this case, the same protective element as the element 1 should also be connected between the input terminal $I_2$ and the power supply line $V_{CC}$.

Because the collector of the transistor $T_0$ is connected to the power supply line $V_{CC}$ and is not connected to the negative-voltage power supply line $V_{EE}$, the protective element 1 can be mounted compactly on the chip, as described later in more detail.

Also, because the protective element 1 operates as a transistor when a large negative voltage is applied to the input terminal $I_1$, a large current is conducted through the transistor $T_0$ in comparison with the conventional protective element $P_1$ or $P_2$ shown in FIG. 3 or 4, resulting in a high tolerance voltage of the ECL circuit 2.

Figure 6A:
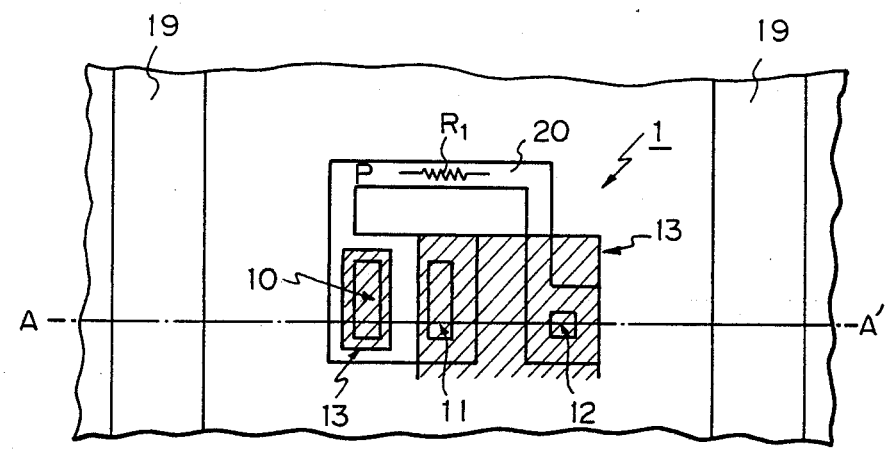
FIG. 6A is a plan view of the physical structure of the protective element shown in FIG. 5.
Figure 6B:
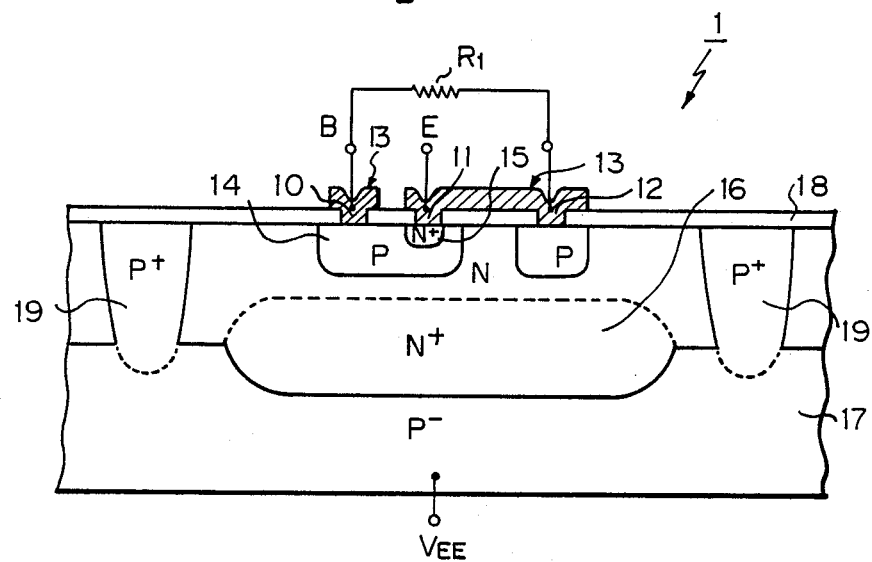
FIG. 6B is a cross-sectional view taken along line A—A' of FIG. 6A.
Figure 10:
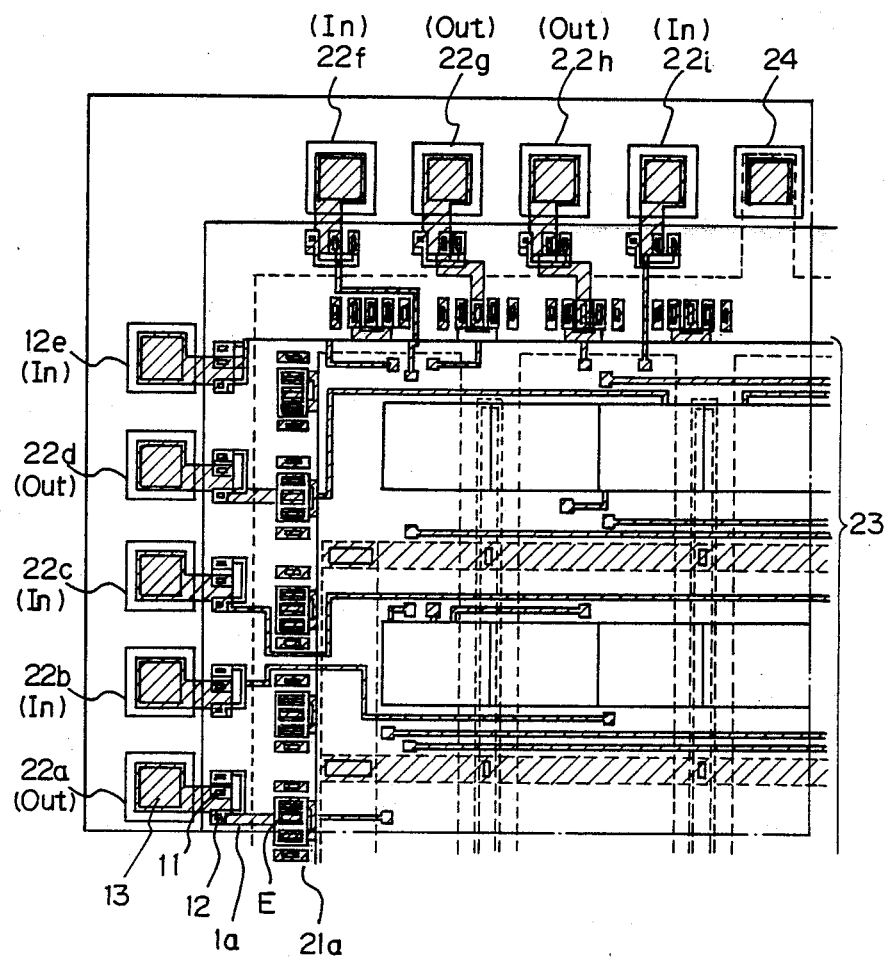
FIG. 10 illustrates a pattern of a first metal wiring layer formed on the ECL gate array shown in FIG. 9.

FIG. 6A is a plan view of the physical structure of the protective element 1 shown in FIG. 5, and FIG. 6B is a cross-sectional view taken along line A-A' of FIG. 6A. Referring to FIGS. 6A and 6B, 10 is a base contact; 11 is an emitter contact; and 12 is a resistor contact. Also, 13 is a first metal wiring layer; 14 is a P-type base diffusion region; 15 is an N+-type emitter diffusion region; 16 is an N+-type collector buried diffusion layer; 17 is a P−-type substrate; 18 is an insulating layer; and 19 is a P+-type isolation region. The structure of the protective element 1 itself is not new. The main feature of the present invention resides in connecting the collector of the NPN transistor $T_0$ to the power supply line $V_{CC}$ in the ECL gate array. As can be seen from these figures, the resistor $R_1$ is formed by a P-type diffusion or polycrystallinesilicon region 20 and is connected between the base contact 10 and the resistor contact 12, which are connected to the first metal wiring layer 13.

Figure 7:
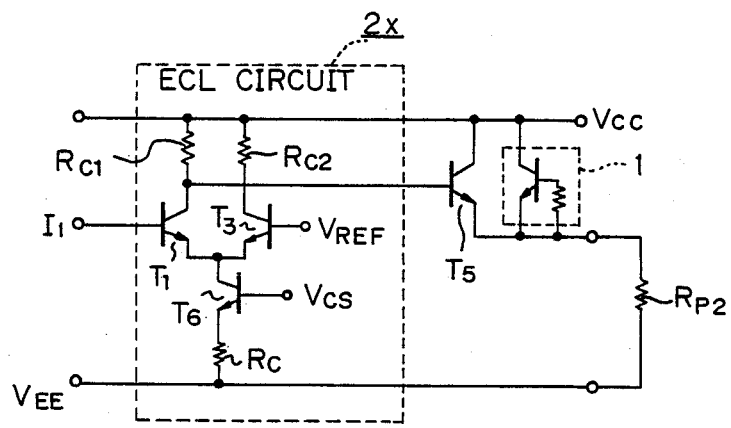
FIG. 7 is a circuit diagram of a final stage ECL gate in the ECL gate array according to another embodiment of the present invention.

FIG. 7 is a circuit diagram of a final stage ECL gate in the ECL gate array, according to another embodiment of the present invention. The difference between FIGS. 5 and 7 is that, instead of connecting the protective element 1 between the power supply line $V_{cc}$ and the input terminal I, the protective element 1 in FIG. 7 is connected between the power supply line $V_{CC}$ and the output terminal $\overline{X}$. That is, in this case, the input terminal I is connected to internal gates in the ECL gate array, and the output terminal $\overline{X}$ is an output pad of the ECL gate array. The emitter-follower-type output transistor $T_5$ is of a large power and is provided on the periphery of the chip of the ECL gate array. Because the collector of the output transistor $T_5$ is connected to the power supply line $V_{CC}$, the advantage of compact mounting of the protective element 1 can be obtained by connecting it between the power supply $V_{CC}$ and the output terminal $\overline{X}$, as described later in more detail.

Figure 8:
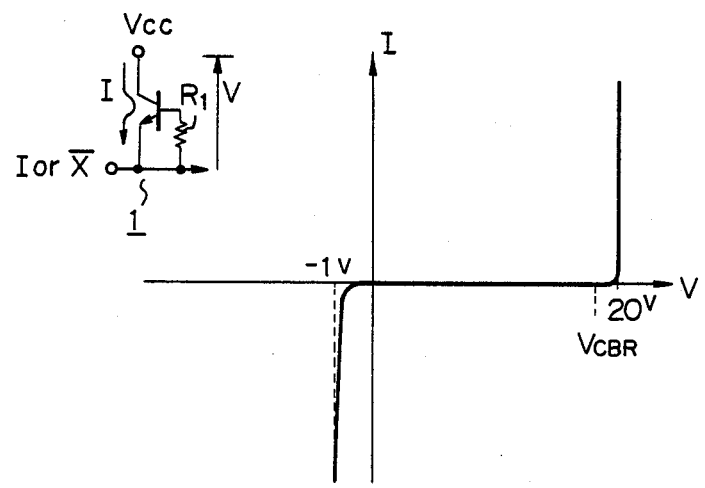
FIG. 8 is a graph illustrating a voltage-current characteristic of the protective element 1 shown in FIGS. 5 and 7.

FIG. 8 is a graph illustrating a voltage-current characteristic of the protective element 1 shown in FIGS. 5 and 7. As can be seen from FIG. 8, for minus charges, when the voltage between the power supply line $V_{CC}$ and the input terminal I or the output terminal $\overline{X}$ exceeds the breakdown voltage $V_{CBR}$ of about 19.2 V between the collector and the base of the transistor $T_0$, breakdown occurs between the collector and the base so that a current flows through the resistor $R_1$. After the voltage across the resistor $R_1$ reaches the forward voltage of about 0.8 V between the base and the emitter of the transistor $T_0$, the transistor $T_0$ is turned on so that a current flows from the collector to the emitter, resulting in the voltage between the collector and the emitter being clamped at about 20 V. Then the high electrostatic charges (minus charges) applied to the input or the output terminal are drawn by the transistor $T_0$ in the voltage level of VCBR with high speed so that the device in the chip can be protected from being destroyed. Also, for plus charges, when the voltage between the power supply line $V_{CC}$ and the input terminal I or the output terminal $\overline{X}$ becomes the forward voltage $V_{BC}$ of about 0.8 V between the base and the collector of the transistor $T_0$, a current flows from the emitter to the collector by reverse transistor action, resulting in the clamped voltage of 1 V between $V_{CC}$ and the input terminal or the output terminal. Thus, plus charges applied to the input terminal I or the output terminal $\overline{X}$ are passed through the protective element 1 so that the ECL circuit device is protected from being destroyed by static electricity.

Figure 9:
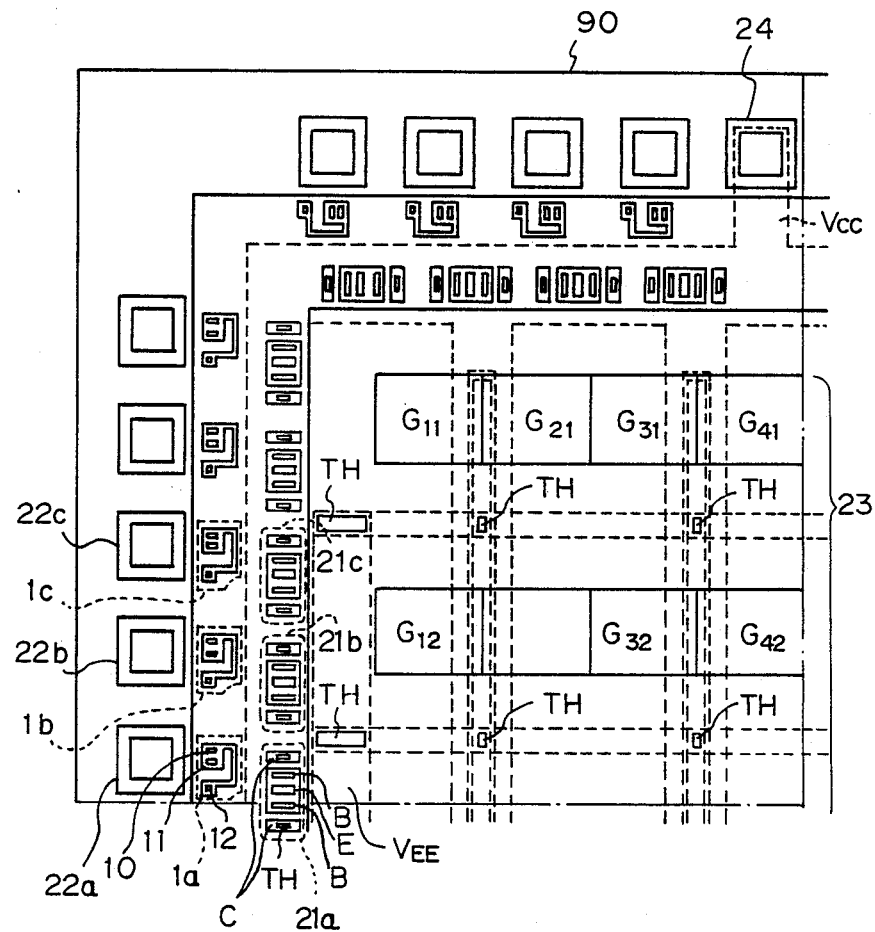
FIG. 9 is a plan view illustrating a pattern part of the ECL gate array according to an embodiment of the present invention.

FIG. 9 is a plan view illustrating a pattern of a part of the ECL gate array. In FIG. 9, the upper left corner of a chip 90 of the ECL gate array is illustrated. The chip 90 has, on its central portion, an internal gate region 23 having a plurality of internal gates $G_{11}$, $G_{21}$, $G_{31}$, $G_{41}$, ..., $G_{12}$, $G_{22}$, $G_{32}$, $G_{42}$, ... On the periphery of the internal gate region 23, there are provided a plurality of emitter-follower-type output transistors 21a, 21b, 21c, ... each of which is the same large power transistor as the transistor $T_4$ or $T_5$ in FIG. 1, FIG. 5, or FIG. 7 when the ECL gate is of the final stage. Each of the output transistors 21a, 21b, 21c, ... has collector contacts C, base contacts B, and an emitter contact E. It should be noted that the collector contacts C are both for the output transistors 21a, 21b, 21c, ... and for the transistors $T_0$ in protective elements 1a, 1b, 1c, ... The protective elements 1a, 1b, 1c, ... are arranged on the periphery of the output transistors 21a, 21b, 21c, ... Each of the protective elements 1a, 1b, 1c, ... has the same structure as that shown in FIGS. 6A and 6B. On the periphery of the protective elements 1a, 1b, 1c, ..., a plurality of input/output pads 22a, 22b, 22c, ... are arranged. Reference number 24 represents a power supply pad connected to the power supply line $V_{CC}$. Within the input/output pads 22a, 22b, 22c, ..., the collector contacts C, or other portions, there are a number of through holes TH.

FIG. 10 illustrates a pattern of the first metal wiring layer 13 formed on the ECL gate array shown in FIG. 9. In FIG. 10, the portions illustrated by slash lines are wirings of the first metal wiring layer 13, usually formed by an aluminum layer. By the first metal wiring layer 13, each of the input/output pads 22a, 22b, 22c, ... is connected to the emitter contact 11 of the corresponding protective element 1 and to the resistor contact 12, which is connected through a polycrystallinesilicon layer to the base contact 10. Also, by the first metal wiring layer 13, each of the input/output pads 22a, 22b, and 22c is connected to the emitter contact E of the corresponding output transistor 21 or to the base contact (not shown in FIG. 10) of an input transistor $T_1$ (FIG. 5 or FIG. 7) arranged in the internal gate array. Therefore, in the ECL gate array shown in FIG. 10, the output pads are pads 22a, 22d, 22g, and 22h which are respectively connected to the emitter; contacts E of the corresponding output transistors 21. Also, the input pads are pads 22b, 22c, 22e, 22f, and 22i, which are respectively connected through metal wirings to the base contacts of the input transistors arranged in the internal gate region 23. The metal wirings formed by the first metal wiring layer 13 substantially extend in the horizontal direction.

Figure 11:
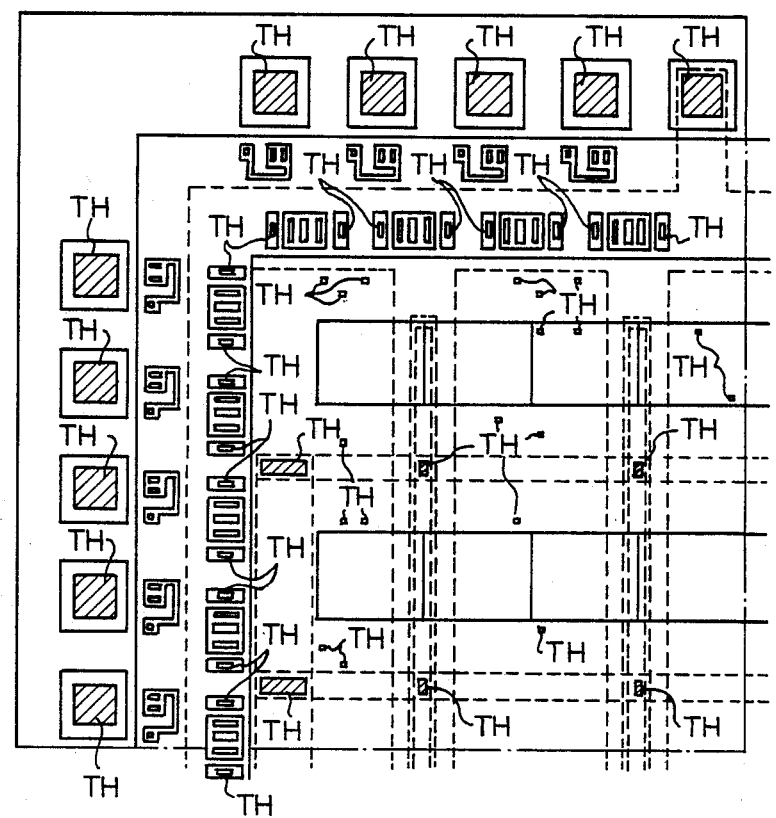
FIG. 11 illustrates through holes formed on the ECL gate array shown in FIG. 9.

FIG. 11 illustrates through holes formed on the ECL gate array shown in FIG. 9. In FIG. 11, the portions indicated by reference characters TH are throughholes for connecting the first metal wiring layer 13 (FIG. 10) and a second metal wiring layer 25 (FIG. 12) formed on the first metal wiring layer shown in FIG. 10.

Figure 12:
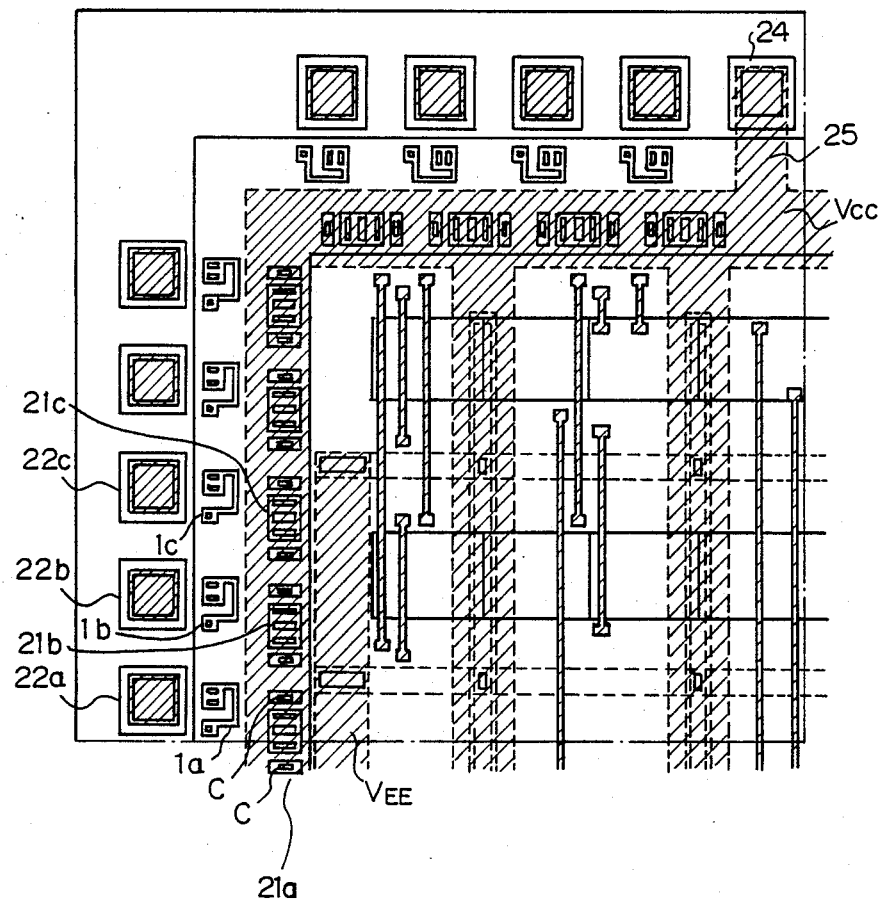
FIG. 12 illustrates a pattern of a second metal wiring layer formed on the ECL gate array shown in FIG. 9.

FIG. 12 illustrates a pattern of the second metal wiring layer 25 formed on the ECL gate array shown in FIG. 9. In FIG. 12, the portions illustrated by slash lines are wirings of the second metal wiring layer 25, usually formed by an aluminum layer. Especially, the power supply line $V_{CC}$ is formed by the second metal wiring layer 25 and extends from the power supply pad 24 to the collector contacts C of the output transistors 21a, 21b, 21c, . . . . The negative-voltage power supply line $V_{EE}$ is formed on an inner side of the power supply line $V_{CC}$. As described before, the collector contacts C are common for the transistors $T_0$ in the protective elements 1a, 1b, 1c, . . . and for the output transistors 21a, 21b, 21c, . . . . The wirings formed by the second metal wiring layer substantially extend in the vertical direction. That is, the transistor $T_0$ in the protective element 1a is formed on the same collector land as the corresponding emitter-follower-type output transistor 21a. Similarly, the other transistors $T_0$ in the other protective elements 1b, 1c, . . . are respectively formed on the same collector lands as the corresponding output transistors 21b, 21c, . . .

As illustrated in FIGS. 9 through 12, since the power supply line $V_{CC}$ extends on the emitter-follower-type output transistors 21a, 21b, 21c, . . . so as to contact with collector contacts C and because the collectors of the transistors $T_0$ in the protective elements 1a, 1b, 1c, . . . are respectively formed on the same collector lands as the output transistors 21a, 21b, 21c, . . . , wiring of the power supply line $V_{CC}$ to the collectors of the transistors $T_0$ in the protective elements 1a, 1b, 1c, . . . is not necessary. Therefore, according to the embodiments of the present invention, wiring becomes easy and the integration degree is improved in comparison with the conventional device in which a protective element is connected to a negative-voltage power supply line $V_{EE}$.

There are various possible modifications of the protective element 1, as shown in FIGS. 13A through 13F.

Figure 13A:
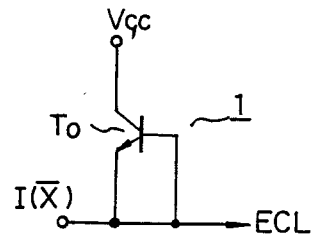
FIGS. 13A through 13F show variations of the protective element according to various embodiments of the present invention.

In FIG. 13A, the base of the transistor $T_0$ is directly connected to the input/output terminal I($\overline{X}$) without inserting the resistor $R_1$. In practice, however, a parasitic resistor may usually be present between the base and the input/output terminal I($\overline{X}$). The tolerance voltage in this case is nearly equal to $V_{CBO}$ instead of $V_{CER}$.

When the resistance of the resistor $R_1$ is not so large, $V_{CBO}$ is nearly equal to $V_{CER}$. This circuit construction has a disadvantage of large amount of heat generated between the collector and the base when junction breakdown occurs between them because the base current from the base to the input/output terminal I($\overline{X}$) is not limited. However, this circuit shown in FIG. 13A can also act as a protective element.

Figure 13B:
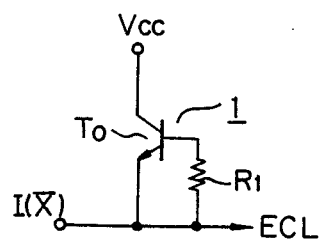

The circuit shown in FIG. 13B is the same as the protective element 1 shown in FIG. 5 or 7. The resistor $R_1$ is provided for limiting the base current so that the current flowing from the collector to the base is limited, resulting in a small amount of heat between the junction.

Figure 13C:
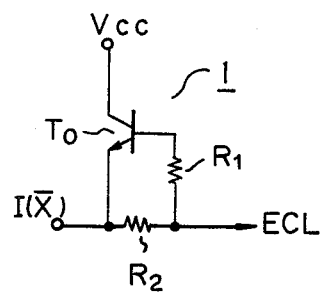

In FIG. 13C, an additional resistor $R_2$ is connected between the resistor $R_1$ and the input/output terminal I($\overline{X}$). The resistor $R_2$ functions to prevent oscillation.

Figure 13D:
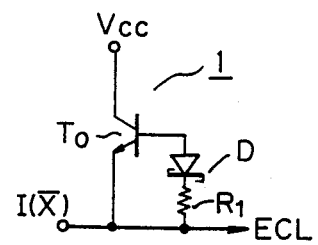

In FIG. 13D, a Schottky barrier diode D is connected between the base and the resistor $R_1$ in order to obtain high speed operation of the protective element 1.

Figure 13E:
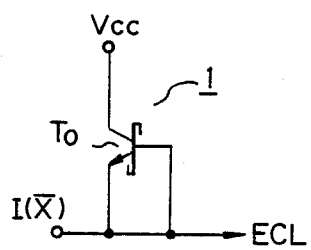

In FIG. 13E, a Schottky barrier transistor $T_{0a}$ is provided in place of the transistor $T_0$ in FIG. 13A. The Schottky barrier transistor $T_{0a}$ also operates at high speed.

Figure 13F:
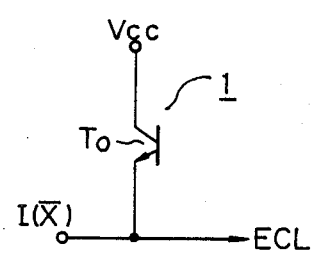

In FIG. 13F, the base is opened. In this case, the tolerance voltage is nearly equal to the collector-emitter breakdown voltage $V_{CEO}$. Although the breakdown voltage $V_{CEO}$ between the collector and the emitter when the base is opened is not a fixed value and may vary depending on the manufacturing process, this circuit can also act as a protective element.

Figure 14:
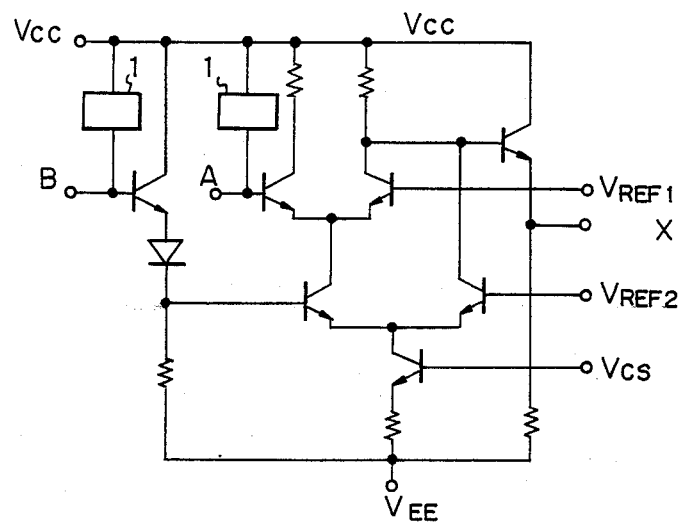
FIG. 14 is a circuit diagram of a series gate circuit according to still another embodiment of the present invention.

FIG. 14 is a circuit diagram of a series gate circuit according to still another embodiment of the present invention. The circuit shown in FIG. 14 receives two input logical signals at its two input terminals A and B and provides at its output a logical product of the two input logical signals. In this case also, the protective elements 1 shown in FIG. 5, 7, or 13A through 13F are connected between the power supply line $V_{CC}$ and the input terminals A and B. The effects of this connection are similar to the foregoing embodiments.

The present invention is not restricted to the above-described embodiments. Various changes and modifications are possible without departing from the spirit of the present invention.

Figure 15:
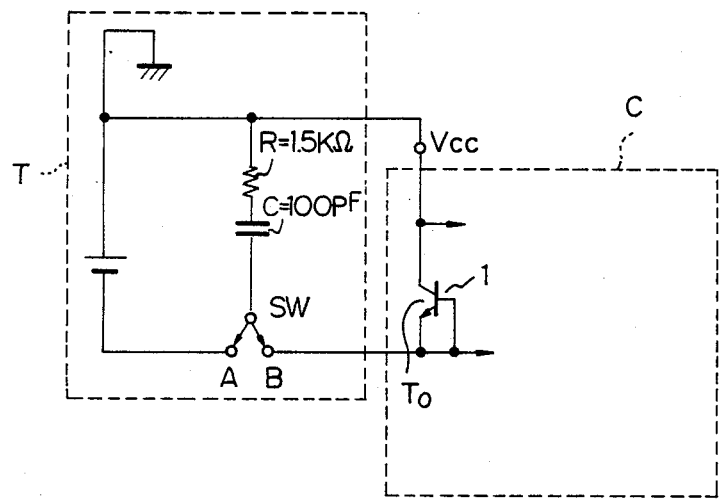
FIG. 15 is a circuit diagram of a test circuit for examining the effects of the circuit devices provided according to the various embodiments of the present invention.

FIG. 15 is a circuit diagram of a test circuit for examining the effects of the circuit devices provided according to the various embodiments of the present invention. In FIG. 15, the protective element 1 is of the type shown in FIG. 13A, which is without the base resistor $R_1$. The protective element 1 is included in a circuit C to be protected and is connected to an input terminal or an output terminal of the circuit C. A test circuit T is connected to the circuit C. The test is executed in accordance with the "MIL standard measuring method". Upon the test, a switch SW is turned to a side A so as to charge a capacitor having a capacity of 100 pF. Then, the switch SW is turned to a side B so as to discharge the charges stored in the capacitor C through a resistor R having a resistance of 1.5 kΩ. The above operation is repeated while the voltage power supply is gradually changed. The tolerance voltage is supervised by a curve tracer. In such a test, the following results are obtained.
(1) Tolerance voltages against destruction of an input terminal
    (i) When the protective element 1 is not provided,
        (a) the positive tolerance voltage is 500 V, and
        (b) the negative tolerance voltage is −250 V.

(ii) When the protective element 1 is provided,
 (a) the positive tolerance voltage is increased to 1800 V, and
 (b) the negative tolerance voltage is decreased to −900 V.

(2) Tolerance voltages against destruction of an output terminal
 (i) When the protective element 1 is not provided,
  (a) the positive tolerance voltage is 600 V, and
  (b) the negative tolerance voltage is −1500 V.
 (ii) When the protective element 1 is provided,
  (a) the positive tolerance voltage is increased to more than 3000 V, and
  (b) the negative tolerance voltage is decreased to lower than −3000 V.

From the foregoing it will be apparent that, according to the present invention, in a bipolar-type semiconductor device such as an ECL gate array, by providing protective elements between input/output pads and a power supply line, wirings between the protective elements and the collectors of emitter-follower-type output transistors become unnecessary, so that the fabrication of the protective elements on a chip of the semiconductor device becomes easy and the integration degree of the semiconductor device is improved. In addition, since a large current can be conducted through transistors in the protective elements, the tolerance voltage of the input transistors or the output transistors can be increased.

We claim:

1. A semiconductor device comprising:
 a semiconductor chip;
 a high potential level power supply line arranged on said peripheral portion of said chip;
 an internal gate region having a plurality of internal gates arranged on a central portion of the chip, said internal gate comprising an ECL gate having a pair of transistors with commonly connected emitters and collectors operatively connected to said high potential level power supply line through a resistor;
 a plurality of emitter-follower-type output transistors arranged on a peripheral region of said chip and on an outer region of said internal gate region, said output transistors having a collector operatively connected to said high potential level power supply line, a base for receiving signals from said internal gates and an emitter for outputting signals to an external portion of said semiconductor device, said output transistors being NPN type;
 a plurality of input/output pads arranged on said peripheral region of said chip and on an outer region of said emitter-follower-type output transistors, said input/output pads comprising a first pad operatively connected to said emitter of the output transistor to operate as an output pad, and a second pad operatively connected to said base of the transistor of the ECL gate to operate as an input pad;
 a plurality of protective elements arranged in a vicinity of said input/output pads and of said high potential level power supply line, said protective elements comprising an NPN type transistor having a collector operatively connected to said high potential level power supply line, an emitter operatively connected to said input/output pads, and a base operatively connected to said input/output pad, said protective elements being conductive when a high electrostatic energy is applied to said input/output pads, for preventing destruction of said transistors of the ECl gate or said output transistors;
 wherein each of said output transistors and a corresponding one of said transistors of the protective elements are formed within the same collector land, and said high potential level power supply line extends over said collector land and is connected to said collector land, base regions of said protective transistors and output transistors are formed in said collector land respectively, emitter regions of said protective transistors and output transistors are formed in said base regions thereof respectively; and
 a low potential level power supply line being formed on said chip.

2. A semiconductor device as set forth in claim 1, wherein said protective transistors have a base connected through a base current limiting resistor to one of said input/output pads.

* * * * *